United States Patent
Konishi (10) Patent No.: US 6,765,281 B2
(45) Date of Patent: Jul. 20, 2004

(54) SEMICONDUCTOR APPARATUS WITH A STABLE CONTACT RESISTANCE AND A METHOD OF MAKING THE SEMICONDUCTOR APPARATUS

(75) Inventor: Junichi Konishi, Hyogo-ken (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 10/305,540

(22) Filed: Nov. 27, 2002

(65) Prior Publication Data

US 2004/0099930 A1 May 27, 2004

(51) Int. Cl.[7] .............................................. H01L 29/00
(52) U.S. Cl. ...................... 257/510; 257/66; 257/72; 257/448; 257/536; 438/166; 438/404; 438/592
(58) Field of Search ........................... 257/66, 72, 448, 257/510, 536; 438/166, 404, 592

(56) References Cited

U.S. PATENT DOCUMENTS

| | | | |
|---|---|---|---|
| 4,992,393 A | | 2/1991 | Kosaka et al. |
| 5,073,815 A | | 12/1991 | Kosaka et al. |
| 5,077,235 A | * | 12/1991 | Kosaka ........................ 438/404 |
| 5,310,446 A | | 5/1994 | Konishi et al. |
| 5,946,561 A | * | 8/1999 | Yamazaki et al. .......... 438/166 |
| 6,191,018 B1 | * | 2/2001 | Yue et al. .................... 438/592 |
| 6,504,226 B1 | * | 1/2003 | Bryant ........................ 257/510 |

FOREIGN PATENT DOCUMENTS

| | | |
|---|---|---|
| JP | 05-029346 | 5/1993 |
| JP | 05-055520 | 5/1993 |
| JP | 05-235276 | 10/1993 |
| JP | 05-036624 | 12/1993 |
| JP | 06-069207 | 11/1994 |
| JP | 07-183526 | 7/1995 |
| JP | 10-032246 | 3/1998 |

* cited by examiner

Primary Examiner—David Nelms
Assistant Examiner—Dao H. Nguyen
(74) Attorney, Agent, or Firm—Cooper & Dunham LLP

(57) ABSTRACT

A semiconductor apparatus includes a MOS transistor and a resistive element having insulative first polysilicon and conductive second polysilicon films, an insulating film for a resistive element, and a third polysilicon film. The second polysilicon film is formed in a region adjacent each side edge of the first polysilicon film, and has a contact hole formed therein. The third polysilicon film determines a resistance value of the resistive element, and is continuously formed on the second polysilicon film and the insulating film formed on the first polysilicon film. The MOS transistor is formed in an active region surrounded by the field insulating film, and includes a gate oxide film and a gate electrode including a polysilicon film formed as a lower layer with the second polysilicon film and a polysilicon film formed as an upper layer with the third polysilicon film. A method of making this semiconductor apparatus is also described.

7 Claims, 6 Drawing Sheets

SEMICONDUCTOR APPARATUS WITH A STABLE CONTACT RESISTANCE AND A METHOD OF MAKING THE SEMICONDUCTOR APPARATUS

BACKGROUND

1. Field

This patent specification describes a semiconductor apparatus and method of making the same, and more particularly a semiconductor apparatus with a stable contact resistance and a method of making the semiconductor apparatus.

2. Discussion of The Background

A highly integrated SRAM (static random access memory) and a hybrid LSI (large-scale integration) circuit with an analog circuit, typically use a relatively high resistive element made of a polysilicon film.

A resistive value of a resistive element is generally expressed by an equation;

$$R=(\rho/t) \times (L/W),$$

wherein R represents a resistive value, $\rho$ represents a resistivity, t represents a film thickness, L represents a length of the resistive element, and W represents a width of the resistive element.

From the above equation, it is understood that an increase of one or both of the resistivity $\rho$ and the length L or a decrease of one or both of the film thickness t and the width W increases the resistive value R. A decrease of the film thickness t is useful as a method of stably increasing the resistive value R. However, it also causes problems such as those discussed below.

Figure 1:
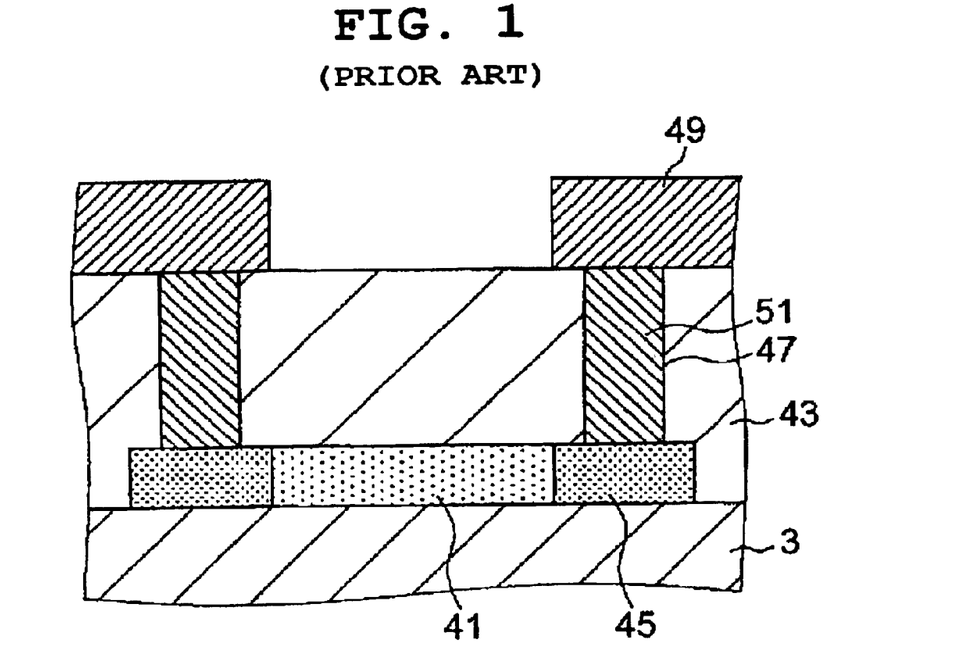
FIG. 1 is a cross-section view of a semiconductor device made with a background method.

FIG. 1 is a schematic diagram showing a cross section view of a polysilicon thin film resistive element with a contact hole for connecting the thin film resistive element to a metal wiring. In FIG. 1, a resistive element pattern 41 is formed on a field oxide film 3 formed on a semiconductor substrate. The resistive element pattern 41 is made of a polysilicon film including an N-type or P-type impurity. On the resistive element pattern 41, an inter-layer insulating film 43 is formed. To form a contact to the resistive element 41, a relatively low resistive region 45 including a relatively high concentration impurity is normally formed to both sides of the resistive element pattern 41 to have a better electrical conductivity. A contact hole 47 is formed in the inter-layer insulating film 43 to the low-resistive region 45. A metal wiring layer 49 is formed on the inter-layered film 43. A conducting filler 51 fills in the contact hole 47 to electrically connect the low-resistive region 45 and the metal wiring layer 49.

Figure 2:
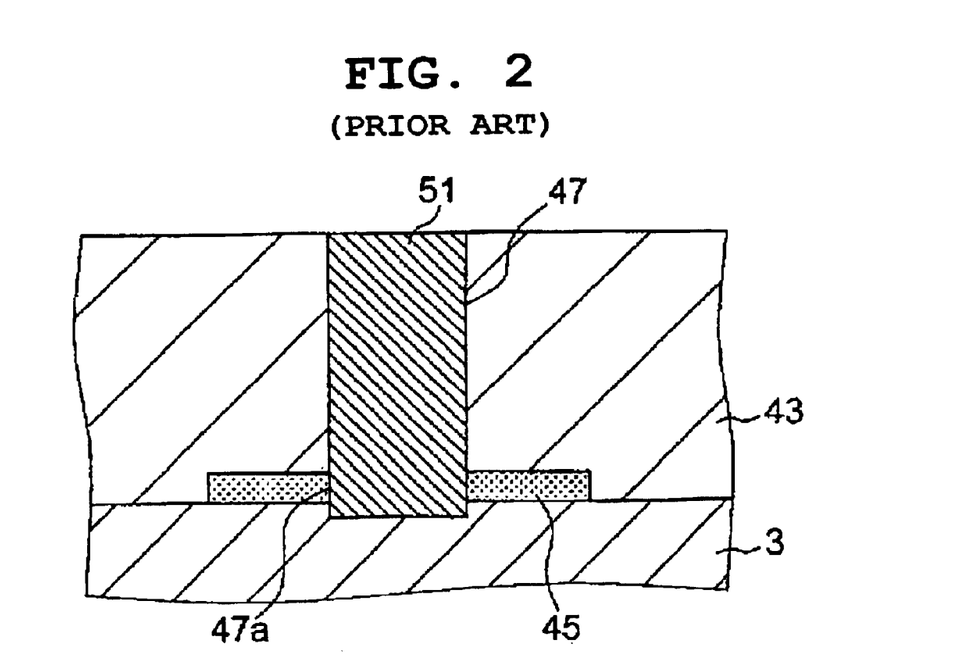
FIG. 2 is a cross-section view for explaining a drawback of the background method.

When the polysilicon film constituting the resistive element 41 and the low-resistive region 45 are made thin to increase a resistance value of the resistive element 41, the low-resistive region 45 may unexpectedly be etched through by the dry etching used to form the contact hole 47. As a result, the bottom of the contact hole 47 comes through the low-resistive region 45 and reaches the base, the field oxide film 3, as shown in FIG. 2. In this case, a contact area between the conducting filler 51 filled in the contact hole 47 and the low-resistive region 45 is limited to a side portion 47a of the contact hole 47 and a contact resistance consequently increases. As a result, an attempt to make a desired resistive value by determining the length and width of the resistive element 41 fails and such a desired resistive value is not obtained.

One attempt to solve the above-mentioned problem is to make thicker the polysilicon film in the region forming the contact hole. This attempt is described, for example, in Japanese Laid-Open Patent Application Publication No. 05-055520, Japanese Laid-Open Patent Application Publication No. 06-069207, Japanese Laid-Open Patent Application Publication No. 10-032246, and Japanese Laid-Open Patent Application Publication No. 10-163430.

Figure 3:
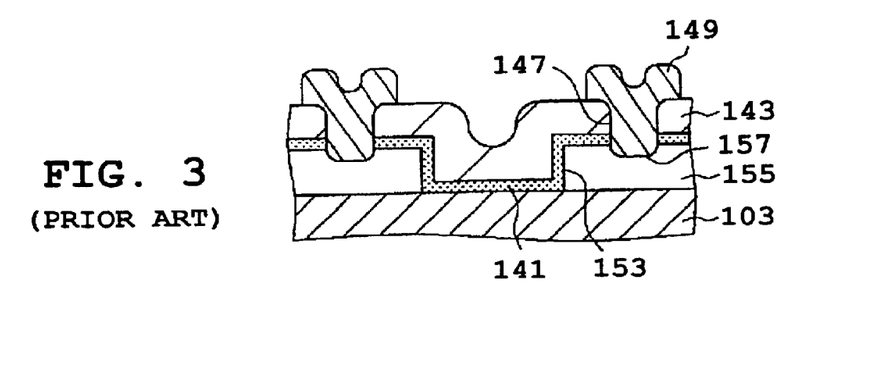
FIGS. 3–5 are cross-section views of semiconductor devices made with different background methods.

For example, a first background method described in Japanese Laid-Open Patent Application Publication No. 05-055520 is shown in FIG. 3. This method forms a thick polysilicon film 155 for a low-resistant portion on a first insulating film 103 (i.e., the field oxide film 3). The polysilicon film 155 includes an additive of a high concentration impurity to make an electrical connection in a wiring region via a metal wiring layer 149 and a contact portion 147 (i.e., similar in function to contact hole 47) for an electrode. After that, the polysilicon film 155 is etched to have an opening 153 for a high-resistive portion, reaching the first insulating film 103. Then, a thin polysilicon film 141 (i.e., similar in function to resistive element pattern 41) is formed to cover the entire surfaces of the first insulating film 103 including the opening 153 and the polysilicon film 155. The thin polysilicon film 141 is for a high-resistive portion and includes no impurity additives or a relatively low concentration impurity additive. After that, a second insulating film 143 (i.e., the inter-layer insulating film 43) is formed on the entire surface of the thin polysilicon film 141 and, in the second insulating film 143, the contact portion 147 for an electrode is formed.

In this way, the first background method attempts to avoid variations of the value of contact resistance by having the polysilicon film 155 underneath the contact portion 147 which may include a contact opening portion 157 coming through the thin polysilicon film 141 that constitutes a resistive element.

When the first background method is applied to a manufacturing process for a SRAM (static random access memory) or a hybrid LSI (large scale integration) circuit, for example, it is needed to form a polysilicon-made gate electrode for a MOS (metal oxide semiconductor) transistor in addition to the resistive element pattern which is the thin polysilicon film 141. This patent specification uses the term MOS for FET (field effect transistors) using a gate made of any conductive material such as a metal, a polysilicon, etc. When an electrode of the MOS transistor is formed with the thick polysilicon film 155, a residue film may be formed from the thin polysilicon film 141 on the side of the polysilicon electrode made from the thick polysilicon film 155. Such residue film on the electrically conductive film can significantly affect the characteristic of the transistor. To avoid the generation of such residue, the process may become excessively complex.

Figure 4:
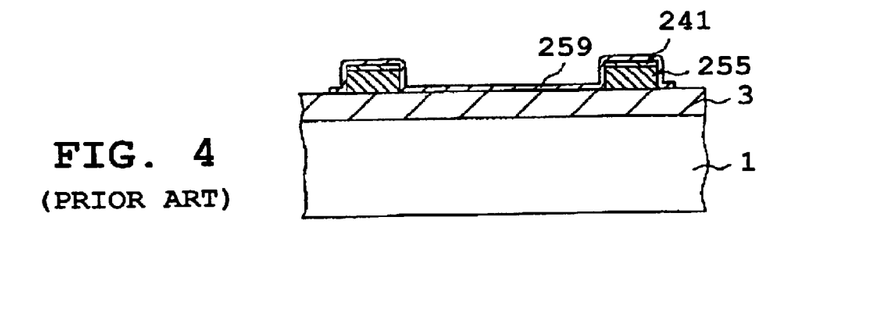
Figure 5:
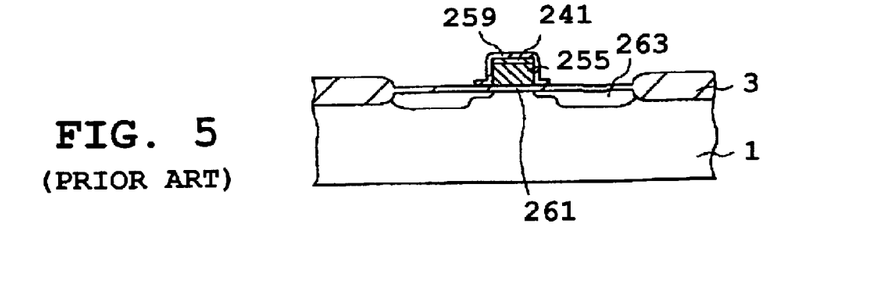

A second background method is described in Japanese Laid-Open Patent Application Publication No. 06-069207, and its procedure is shown in FIGS. 4 and 5. As shown in FIG. 4, a first polycrystalline silicon layer 255 (i.e., similar in function to thick polysilicon film 155) is formed on the insulating film 3 formed on the semiconductor substrate 1. The upper surface of the first polycrystalline silicon layer 255 is covered with a silicon dioxide film 259 serving as an insulating film, and a second polycrystalline silicon layer 241 (i.e., similar in function to resistive element pattern 41) is formed on the silicon dioxide 259 and the insulating film 3 of the substrate surface such that the second polycrystalline silicon layer 241 contacts by its side the silicon dioxide 259 and the insulating film 3.

With this arrangement, a multi-layered structure of the first and second polycrystalline silicon layers 255 and 241 is applied to the region of the wiring and the contact holes, and only the second polycrystalline silicon layer 241 is applied to the high resistive region. Therefore, as in the case of the first background method, the contact resistive value would not be affected by the second polycrystalline silicon layer 241 even if the second polycrystalline silicon layer 241 comes through around the contact opening area because there is the first polycrystalline silicon layer 255 underneath the second polycrystalline silicon layer 241.

As shown in FIG. 5, the second background method forms a gate insulating film 261 on the semiconductor substrate 1 as it forms the resistive element. Then, the first polycrystalline silicon layer 255 and the silicon dioxide film 259 are formed on the gate insulating film 261. After that, the second polycrystalline silicon layer 241 is formed to cover the first polycrystalline silicon layer 255 and the silicon dioxide film 259. Then, from above, an impurity ion is implanted to the semiconductor substrate 1 so as to form a diffusion region 263 serving as a source or a drain.

However, when the first polycrystalline silicon layer 255 is used as a gate electrode of the MOS transistor, the second polycrystalline silicon layer 241 which is of high resistivity directly contacts the side of the gate electrode, just as in the case of the first background method, causing similar problems.

Another attempt to solve the above-mentioned problem of the variations in the contact resistive value is to form a metal silicide layer only on a region in an upper surface of a thin polysilicon film where a contact hole is formed in order to avoid an etching leakage during the formation of the contact hole. This attempt is described, for example, in Japanese Laid-Open Patent Application Publication No. 05-029346 and Japanese Laid-Open Patent Application Publication No. 07-183526.

This attempt uses a fact that the etching rate of the metal silicide layer is lower than that of the silicon dioxide film and the inter-layer insulating film so that the etching of the metal silicide layer is completed during the etching process to form the contact hole.

For example, a third background method described in Japanese Laid-Open Patent Application Publication No. 07-183526 relates to a method of forming a contact on a thin film transistor and is applied to a process of forming a resistive element made of a thin film polysilicon. However, this document does not describes a method of forming a resistive element made of a thin film polysilicon and a MOS transistor on the same substrate. Therefore, when this method is applied to a process of forming a resistive element made of a thin film polysilicon and a MOS transistor on the same substrate, the same problem as with the first background method may occur. That is, a residue of the thin polysilicon film for the resistive element may remain on the side of the polysilicon side.

There is further another attempt to solve the above-mentioned problem of the variations in the contact resistive value. This attempt forms an inter-layer insulating film on a high resistive pattern and, after forming a contact hole, fills the contact hole with a silicon. This attempt is also described in Japanese Laid-Open Patent Application Publication No. 05-036624 and Japanese Laid-Open Patent Application Publication No. 05-235276, for example.

For example, Japanese Laid-Open Patent Application Publication No. 05-036624 describes a method in which an electrical contact is arranged in a diffusion area of a thin film transistor. According to this description, this method can form a good contact by again filling in the silicon filler even when the thin silicon film at the bottom of the contact hole is etched and is made even thinner during the forming process of the contact hole.

However, in this method, every contact hole is required to have a common diameter in consideration of the polysilicon injection. For example, when a contact hole has a diameter at least twice greater than the thickness of the silicon thin film, the silicon injection cannot be performed in a perfect manner and a desired contact cannot be achieved.

SUMMARY

This patent specification describes a novel semiconductor apparatus which makes a contact resistance value stable. In one example, a novel semiconductor apparatus includes a semiconductor substrate, a resistive element, and a metal oxide semiconductor transistor. The semiconductor substrate is covered with a field insulating film. The resistive element is formed on the field insulating film. The resistive element includes an insulative first polysilicon film, a conductive second polysilicon film, a resistive-element-aimed insulating film, and a third polysilicon film. The insulative first polysilicon film is formed on the field insulating film. The conductive second polysilicon film is formed in a region adjacent to each side edge of the insulative first polysilicon film in which a contact hole is formed. The resistive-element-aimed insulating film is formed on the insulative first polysilicon film. The third polysilicon film for determining a resistance value is formed in a continuous manner on the conductive second polysilicon film and the resistive-element-aimed insulating film. The metal oxide semiconductor transistor is formed in an active region surrounded by the field insulating film on the semiconductor substrate. The metal oxide semiconductor transistor includes a gate oxide film and a gate electrode which is formed on the gate oxide and includes a multi-layered film. The multi-layered film includes a polysilicon film formed on the gate oxide as a lower layer when the conductive second polysilicon film is formed and a polysilicon film formed on the lower layer as an upper layer when the third polysilicon film is formed.

The resistive-element-aimed insulative film of the resistive element may be made of a silicon dioxide or a silicon nitride.

This patent specification also describes a novel method of making a semiconductor device which makes a contact resistance stable. In one example, this novel method includes the steps of first forming, second forming, third forming, fourth forming, first patterning, fifth forming, sixth forming, second patterning, seventh forming, and eighth forming. The first forming step forms a field insulating film for separating elements and an active region surrounded by the field insulating film on a semiconductor substrate. The second forming step forms a gate oxide film on a surface of the active region. The third forming step forms an insulative first polysilicon film on an entire surface of the semiconductor substrate. The fourth forming step forms a resistive-element-aimed insulating film on the insulative first polysilicon film. The first patterning step patterns the resistive-element-aimed insulating film so that the resistive-element-aimed insulating film remains in a region corresponding to a middle portion of a resistive element formed on the field insulating film. The fifth forming step forms a second polysilicon film at a position adjacent to the insulating first polysilicon film formed underneath the resistive-element-aimed insulating film by diffusing or implanting an impurity to provide a conductivity to the insulating first polysilicon film with a mask of the resistive-element-aimed insulating film. The sixth forming step forms a third polysilicon film determining a resistance value on an entire surface of the semiconductor substrate. The second patterning step patterns the third polysilicon film, the resistive-element-aimed insulating film, the second polysilicon film, and the insulating first polysilicon film to form a resistive element on the field insulating film, including the insulating first polysilicon film, the second polysilicon film adjacent to each edge side of the insulating first polysilicon film, the resistive-element-aimed insulating film, and the third polysilicon film, and a gate electrode of a metal oxide semiconductor transistor in the active region, including the second polysilicon film and the third polysilicon film. The seventh forming step forms an inter-layer insulating film on an entire surface of the semiconductor substrate. The eighth forming step forms a contact hole in the inter-layer insulating film in a region in which the second polysilicon film adjacent to each side of the resistive element and the third polysilicon film are multi-laying.

The resistive-element-aimed insulating film may be made of a silicon dioxide film or a silicon nitride film.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 6, a semiconductor device 100 according to a preferred embodiment is explained.

Figure 6:
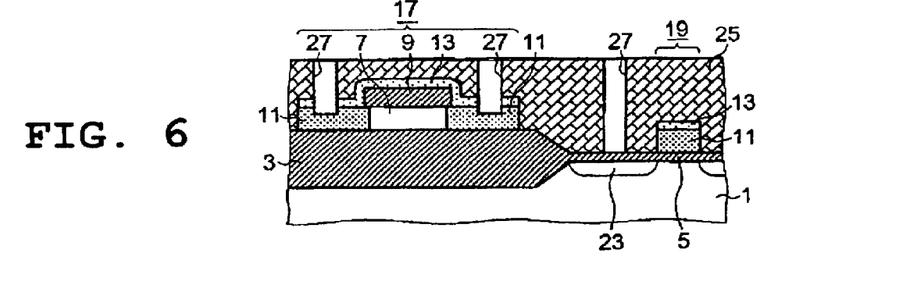
FIG. 6 is a cross-section view of a semiconductor device made with a method according to a preferred embodiment of the present invention.

In FIG. 6, a reference numeral 3 denotes a field oxide film. The field oxide film 3 is formed on a surface of a semiconductor substrate 1 to separate devices. The surface of the semiconductor substrate 1 has an active region surrounded by the field oxide film 3, and a gate oxide film 5 for a MOS (metal oxide semiconductor) transistor is formed on the surface of the active region.

On the gate oxide film 5, a gate electrode 19 is formed, including a second polysilicon film 11 arranged as a lower layer and a third polysilicon film 13 as an upper layer. In the semiconductor substrate 1, high concentration impurity regions 23 constituting a source and a drain of the MOS transistor are formed in the active region to sandwich the gate electrode 19.

A first polysilicon film 7 which includes substantially no impurities and has an insulating nature is formed on the field oxide film 3. The polysilicon film 11 made conductive by an impurity injection at a high concentration level is formed at positions in contact with both side edges of the first polysilicon film 7. A silicon dioxide film 9 is an insulating film and is formed on the first polysilicon film 7 to form a resistive element. The silicon dioxide film 9 may sometimes be referred to as a resistive-element-aimed insulating film. An impurity is injected to form the electrically conductive second polysilicon film 11, through the silicon dioxide film 9 in a continuous manner. The third polysilicon film 13 which determines a resistive value is formed. The first polysilicon film 7, the silicon dioxide film 9, the second polysilicon film 11, and the third polysilicon film 13 which are formed on the field oxide film 3 constitute a resistive element 17.

Reference numeral 25 denotes an inter-layer insulating film which is formed on the entire surface of the semiconductor substrate 1, including the surfaces of the resistive element 17 and the gate electrode 19. In the inter-layer insulating film 25, a contact hole 27 is formed at a position corresponding to a region in which the second polysilicon film 11 and the third polysilicon film 13 of the resistive element 17 are layered and to the high concentration impurity region 23 of the MOS transistor.

Figures 7A, 7B:
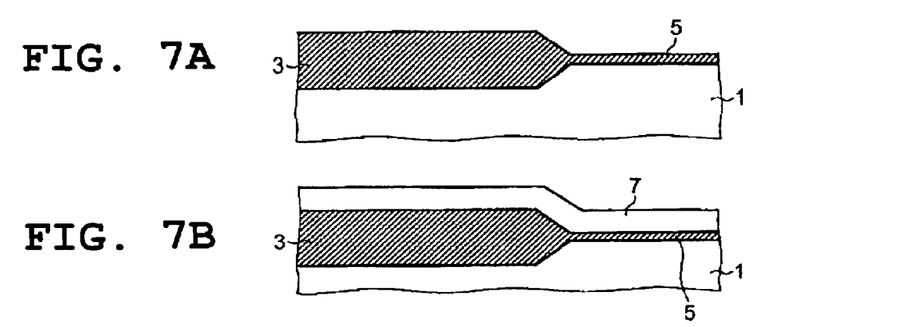
FIGS. 7A–7I are cross-section views for explaining a procedure of the method of making the semiconductor device of FIG. 6.

Referring to FIGS. 7A–7I, a method of making the semiconductor device 100 is explained. FIG. 7A shows a first process in which the field oxide film 3 (which may be referred to as a field insulating film) serving for device separation is formed with a thickness of about 500 nm, for example, in an approximate range of from 400 nm to 1000 nm on the semiconductor substrate 1 using a known technique. Then, the gate oxide film 5 is formed with a thickness of about 20 nm, for example, in an approximate range of from 20 nm to 100 nm in the active region in which the MOS transistor is formed.

The next process (see FIG. 7B) forms the first polysilicon film 7, substantially without impurities and having an insulating nature, to an extent of a thickness of about 300 nm, for example, in a range of from 100 nm to 500 nm. The first polysilicon film 7 is not limited to one having no impurities but may include some impurities so long as it has a sufficiently insulating nature.

The next process (see FIG. 7C) forms the silicon dioxide film 9 for a thickness of about 200 nm, for example, in an approximate range of from 100 nm to 400 nm on the first polysilicon film 7 using, e.g., an LPCVD (low-pressure chemical vapor deposition) method. Then, a patterning is conducted with a photolithography and a dry etching technique to leave the silicon dioxide film 9 as an insulating film for the resistive element in a region corresponding to a region of the high resistive polysilicon, that is, a middle of the resistive element.

The next process (see FIG. 7D) applies, for example, a solid phase diffusion method to inject an amount of an impurity to the first polysilicon film 7 using the silicon dioxide film 9 as a mask to reduce the resistivity of the first polysilicon film 7 so that the first polysilicon film 7 becomes conductive, except for an region under the silicon dioxide film 9. As a result, the second polysilicon film 11 having a reduced resistivity and a conductive nature is formed adjacent to the first polysilicon film 7 that is under the silicon dioxide 9.

The next process (see FIG. 7E) forms the third polysilicon film 13, determining the resistivity value, to an extent of a thickness of about 50 nm, for example, in an approximate range of from 10 nm to 300 nm on the entire surface of the semiconductor substrate 1. After that, phosphorus is injected in a direction indicated by arrows to the third polysilicon film 13 to make a desired value of resistivity, with an ion injection method, for example, an injection energy is 10 keV and an amount of ion injection of $1\times10^{14}$ cm$^{-2}$.

The next process (see FIG. 7F) forms a photoresist pattern 15 in a region for forming a resistive element and a gate electrode of the MOS transistor on a resistive element region and an active region which are disposed on the field oxide film 3.

The next process (see FIG. 7G) forms the resistive element 17 and the gate electrode 19. An anisotropic etching is performed relative to the third polysilicon film 13 and the first polysilicon film 11 using the photoresist pattern as a mask that is later removed. As a result, the resistive element 17 is formed on the field oxide film 3 and the gate electrode 19 of the MOS transistor is formed on the gate oxide film 5 in the active region. At this time, no undesired residue of the third polysilicon film 13 remains, unlike the above-described prior art. As shown in FIG. 7G, the resistive element 17 includes the first polysilicon film 7, the second polysilicon film 11 adjacent to both edges of the first polysilicon film 7, the insulating film 9 for the resistive element, and the third polysilicon film 13. The gate electrode 19 of the MOS transistor includes the third polysilicon film 13 in the upper layer and the second polysilicon film 11 in the lower layer.

The next process (see FIG. 7H) forms the high concentration impurity regions 23 of the MOS transistor. A photoresist pattern 21 is formed to cover the resistive element 17. Then, an impurity is injected to prepare high concentration impurity regions 23 (of which only one is labeled) of the MOS transistor using the ion injection method with the photoresist pattern 21 as a mask. After that, the high concentration impurity regions 23 of the MOS transistor are completed through a heating process.

The next process (see FIG. 1) is a final process. In the process, the inter-layer insulating film 25 is formed on the entire surface of the semiconductor substrate 1. Then, the contact holes 27 are formed at desired positions in the inter-layer insulating film 25 relative to the region where the second polysilicon film 11 adjacent to both edges of the resistive element 17 and the third polysilicon film 13 are layered. As shown in FIG. 7I, the contact holes 27 come through the third polysilicon film 13 and reaches the second polysilicon film 11, and a good electrical contact is made between the second and third polysilicon films 11 and 13 and a wiring material which is filled in the contact holes 27 in a later process. The contact hole 27 is formed also at a desired position relative to the high concentration impurity regions 23 of the MOS transistor.

In this method, the first polysilicon film 7 disposed under the silicon dioxide film 9 includes substantially no impurity and has therefore an extremely high value of resistance such as $10^9\Omega$. Therefore, electrical conduction in the resistive element 17 is not contributed by the first polysilicon film 7 disposed under the silicon dioxide film 9 but is determined by the resistance value of the second polysilicon film 13.

Figure 7C:
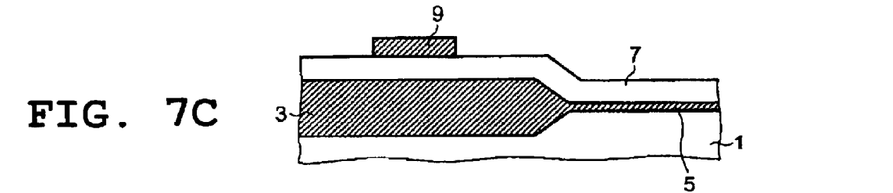

Also, in the process of FIG. 7C, the silicon dioxide film 9 is formed on the first polysilicon film 7 with the LPCVD method. As an alternative, this process of forming the silicon dioxide may be conducted with other methods including a thermal oxidation method or an atmospheric pressure CVD method. The method for patterning the silicon dioxide film 9 is not limited to the dry etching method but may be a wet chemical etching method using a hydrofluoric acid liquid.

Figure 7D:
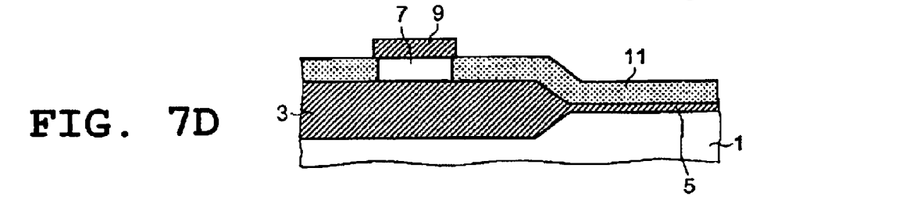
Figure 7E:
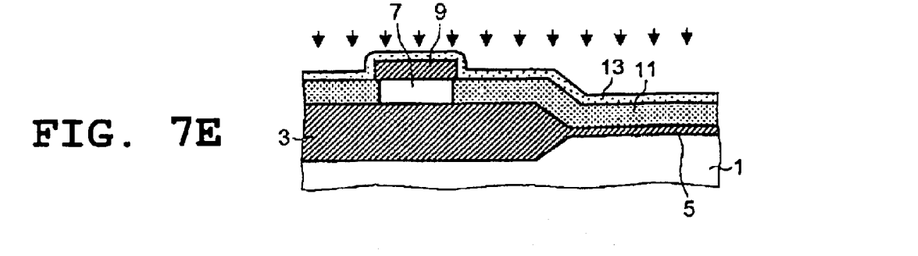
Figure 7F:
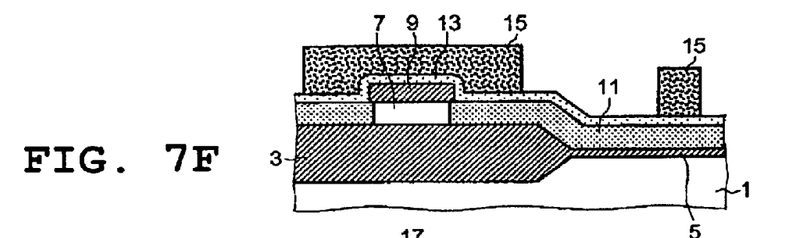
Figure 7G:
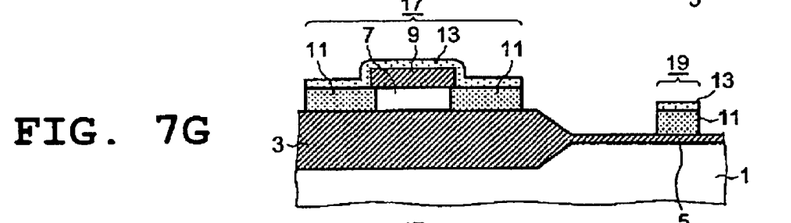
Figure 7H:
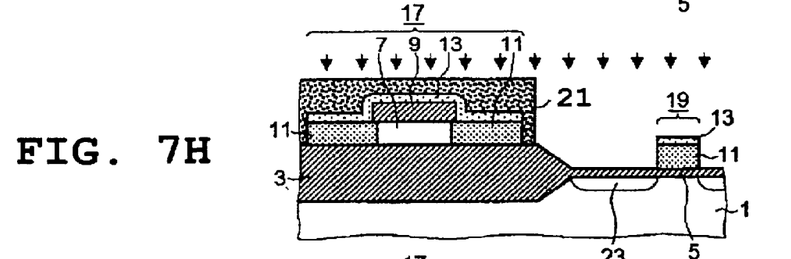
Figure 7I:
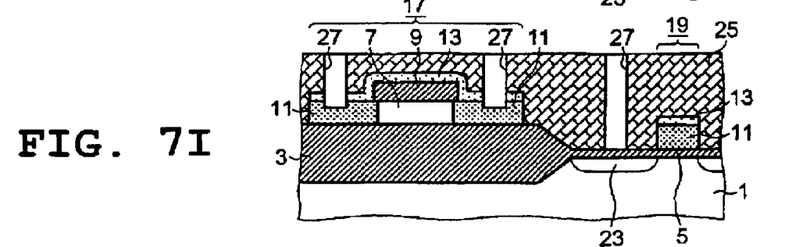

Further, in the process of FIG. 7D, the solid phase diffusion method is used to inject the impurity to the first polysilicon film 7 to form the second polysilicon film 11. As an alternative to the solid phase diffusion method, the ion injection method may also be used. An exemplary procedure using the ion injection method in place of the solid phase diffusion method used in the process of FIG. 7D is explained below.

Figure 8A:
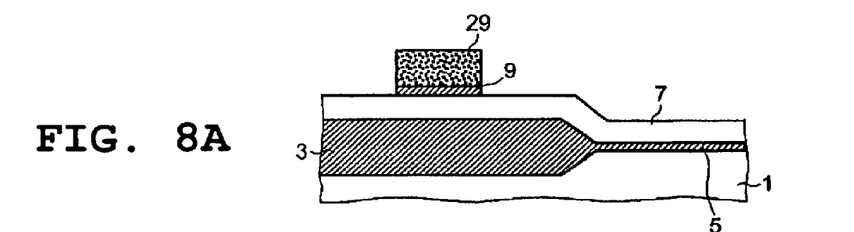
FIGS. 8A and 8B are cross-section views for explaining an alternative process portion to be implemented in the method explained with reference to FIGS. 7A–7I.
Figure 8B:
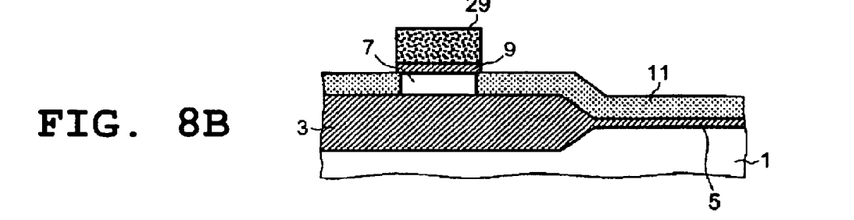

FIGS. 8A and 8B are schematic illustrations for explaining an exemplary procedure using the ion injection method in place of the solid phase diffusion method used in the above-described process of FIG. 7D. Processes explained with reference to FIGS. 8A and 8B correspond to the processes of FIGS. 7C and 7D, and the rest of the processes shown in FIGS. 7A and 7B and 7E–7I remain same. The process of FIG. 8A, which correspond to the process of FIG. 7C, forms the silicon dioxide film 9 having a thickness of about 30 nm, for example, in a range of from 10 nm to 200 nm on the first polysilicon film 7. Then, the photoresist pattern 29 is formed on a region corresponding to the region of the high resistance polysilicon which is the middle of the resistive element using the photolithography technique. After that, the silicon dioxide film 9 serving as the insulating film for the resistive element is formed, with the dry etching method using the photoresist pattern 29 as a mask.

The next process of FIG. 8B, which corresponds to the process of FIG. 7D, forms the second polysilicon film 11. In this process, the ion injection is conducted relative to the first polysilicon film 7 using the photoresist pattern 29 and the silicon dioxide film 9 as masks under the conditions at ion injection energy of 30 keV and injection amount of $1\times10^{16}$cm$^{-2}$.

After the process of FIG. 8B, the photoresist pattern 29 is removed. Then, the resistive element 17 and the MOS transistor are formed in the way described above, as shown in FIGS. 7E–7I.

In the processes of FIGS. 7C and 7D, the solid phase diffusion method involves removing the photresist used for patterning the silicon dioxide film 9 for forming the insulating film 7, before the diffusion takes place. Unlike this method, the above-described alternative ion injection method does not remove the photoresist pattern 29 in the process of FIG. 8A and uses it as a mask for the ion injection performed in the process of FIG. 8B. With this process, the silicon dioxide film 9 is made thinner and the third polysilicon film 13 can be formed in a continuous manner. Accordingly, a step between the sides and center of film 13 at resistive element 17 is reduced in height. As a result, variations in resistivity of the resistive element 17 can be reduced.

Further, in the above exemplary method, the insulating film for the resistive element is formed with the silicon dioxide film 9 but is not limited to it. As an alternative, a silicon nitride film may be used as the insulating film for the resistive element. An exemplary procedure using a silicon nitride film in place of the silicon dioxide film 9 as the insulating film for the resistive element is explained below.

Figure 9A:
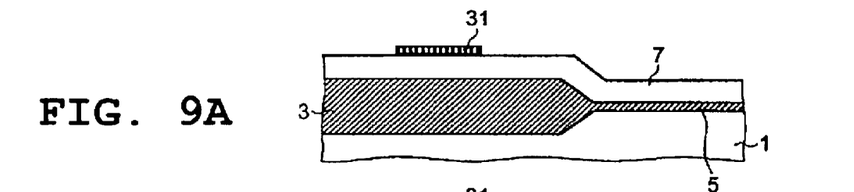
FIGS. 9A–9C are cross-section views for explaining another alternative process portion to be implemented in the method explained with reference to FIGS. 7A–7I.
Figure 9B:
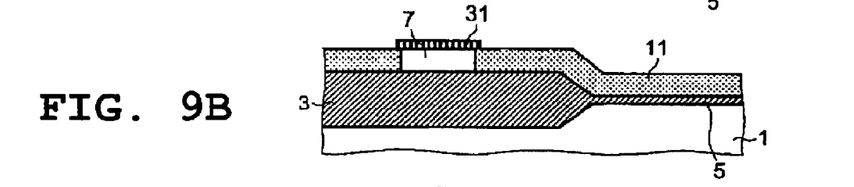
Figure 9C:
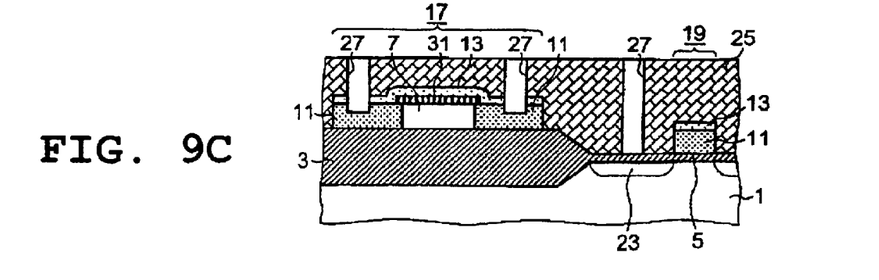

FIGS. 9A–9C are schematic illustrations for explaining an exemplary procedure using a silicon nitride film in place of the silicon dioxide film 9 as the insulating film for the resistive element. Processes explained with reference to FIGS. 9A, 9B, and 9C correspond to the processes of FIGS. 7C, 7D, and 7I, respectively, and the rest of the processes shown in FIGS. 7A and 7B and 7E–7H remain same. The process of FIG. 9A, which correspond to the process of FIG. 7C, forms a silicon nitride film 31 having a thickness of about 30 nm, for example, in a range of from 10 nm to 200 nm on the first polysilicon film 7. Then, a patterning is conducted with the photolithography and dry etching techniques so that the silicon nitride film 31 to be used as the insulating film for the resistive element is left in a region corresponding to the high resistive polysilicon region.

After that, in the next process of FIG. 9B, which corresponds to the process of FIG. 7D, a phosphorus is injected into the first polysilicon film 7 with the solid phase diffusion method, for example, using the silicon nitride film 31 as a mask to make the resistivity of the first polysilicon film 7 low so as to form the second polysilicon film 11.

Since the silicon nitride film 31 has a relatively strong blocking nature against the solid phase diffusion, the silicon nitride film can be formed thinner than the silicon dioxide film. The silicon nitride film 31 having a thickness of the order of 30 nm can sufficiently block the regular solid phase diffusion of the phosphorus.

After that, the resistive element 17 and the gate electrode 19 of the MOS transistor are formed as described above, as shown in FIGS. 7E–7H. As a result, the third polysilicon film 13 is formed in a continuous manner, as shown in FIG. 9C. Accordingly, a step between the sides and center of film 13 is reduced in height, and the third polysilicon film 13 has less deviation in height. As a result, variations in resistivity of the resistive element 17 can be reduced.

In the process of FIG. 9A, the insulating film for the resistive element is formed in a single layer. However, the insulating film for the resistive element may be made of a multi-layered film including a silicon dioxide film as a lower layer and a silicon nitride film as an upper layer. An exemplary procedure for forming a multi-layered insulating film in place of the single layer film is explained below.

Figure 10A:
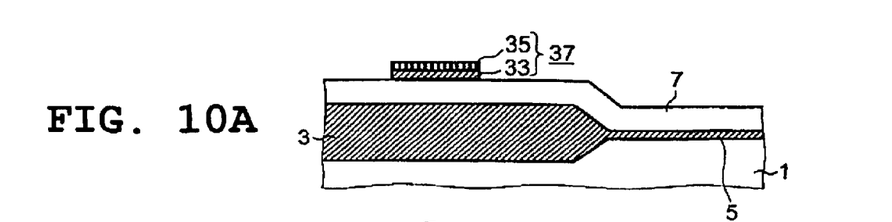
FIGS. 10A and 10B are cross-section views for explaining further another alternative process portion to be implemented in the method explained with reference to FIGS. 7A–7I.
Figure 10B:
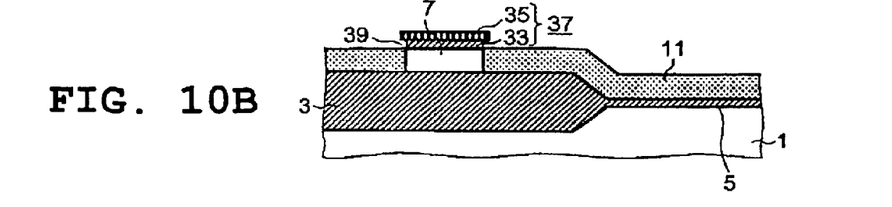

FIGS. 10A and 10B are schematic illustrations for explaining an exemplary procedure for forming a multi-layered insulating film in place of the single layer film. Processes explained with reference to FIGS. 10A and 10B correspond to the processes of FIGS. 7C and 7D, respectively, and the rest of the processes shown in FIGS. 7A and 7B and 7E–7I remain same. The process of FIG. 10A, which correspond to the process of FIG. 7C, forms a silicon dioxide film 33 having a thickness of about 50 nm, for example, in a range of from 10 nm to 100 nm on the first polysilicon film 7. Subsequently, a silicon nitride film 35 having a thickness of about 30 nm, for example, in a range of from 10 nm to 100 nm on the silicon dioxide film 33. After that, the silicon nitride film 35 and the silicon dioxide film 33 are patterned so as to form a multi-layered film 37 including the silicon dioxide film 33 as a lower layer and the silicon nitride film 35 as an upper layer in the region corresponding to the high resistive polysilicon region.

After that, in the next process of FIG. 10B, which corresponds to the process of FIG. 7D, phosphorus is injected into the first polysilicon film 7 with the solid phase diffusion method, for example, using the multi-layered film 37 as a mask to make the resistivity of the first polysilicon film 7 low so as to form the second polysilicon film 11. Since a silicon dioxide film including the phosphorus is formed on the surface of the second polysilicon film 11, the wet chemical etching with a hydrofluoric-acid liquid is performed to remove the undesired silicon dioxide film. In the etching with the hydrofluoric acid liquid, the silicon dioxide film 33 used as the insulating film for the resistive element is covered by the silicon nitride film 35, which protects the dioxide. Accordingly, as a result of the etching with the hydrofluoric acid liquid, the silicon dioxide film 33 will have a hollow 39 on both edges thereof. With the hollow 39, when the third polysilicon film is formed on the second polysilicon film and the insulating film for the resistive element in the following processes, it may not be formed in a continuous manner particularly around the hollow 39. In order to avoid this, the third polysilicon film is formed after the removal of the silicon nitride film 35, which is the upper layer. The silicon nitride film 35 is selectively removed by immersion in a thermal phosphoric acid liquid.

After that, the resistive element 17 and the gate electrode 19 of the MOS transistor are formed in the way as described above, as shown in FIGS. 7E–7H.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application, No. JPAP2001-178868 filed on Jun. 13, 2001 in the Japanese Patent Office, the entire contents of which are incorporated by reference herein.

What is claimed is:

1. A semiconductor device, comprising:
   a semiconductor substrate covered with a field insulating film;
   a resistive element formed over the field insulating film, including:
   an insulative first polysilicon film formed over the field insulating film;
   a conductive second polysilicon film formed adjacent each side edge of the insulative first polysilicon film;
   a resistive-element-aimed insulating film formed over the insulative first polysilicon film; and
   a third polysilicon film for determining a resistance value of said resistive elements, formed in a continuous manner over the conductive second polysilicon film and the resistive-element-aimed insulating film, and
   a metal oxide semiconductor transistor formed in an active region surrounded by the field insulating film on the semiconductor substrate, including:
   a gate oxide film; and
   a gate electrode formed over the gate oxide and including a multi-layered film comprising:
   a polysilicon film formed over the gate oxide as a lower layer when the conductive second polysilicon film is formed; and
   a polysilicon film formed over the lower layer as an upper layer when the third polysilicon film is formed.

2. A semiconductor device as defined in claim 1, wherein the resistive-element-aimed insulative film of the resistive element is made of a silicon dioxide.

3. A semiconductor device as defined in claim 1, wherein the resistive-element-aimed insulative film of the resistive element is made of a silicon nitride.

4. A semiconductor device comprising:
- a substrate (1), a field insulating film (3) over a part of the substrate, and a resistive element (17) over the field insulating film and a transistor (19) laterally spaced from the resistive element along the substrate;
- said resistive element comprising a first layer (7) of a high electrical resistivity polysilicon, a second layer (11) of high electrical conductivity polysilicon laterally flanking at least one side of the first layer, a third layer (9 or 31 or 33) of a high electrical resistivity material over the first layer, and a fourth layer (13) of a polysilicon having a selected electrical resistivity, said fourth layer extending laterally over the third layer and over at least a substantial part of the second layer, and said second layer and said fourth layer being in electrical contact with each other;
- said transistor comprising active regions (23) on said substrate laterally spaced from each other, a gate insulating material (5) over at least the lateral spacing between said active regions, and a gate structure (19) over said gate insulating material and at least said lateral spacing, said gate structure comprising a layer (11) of a high electrical conductivity polysilicon formed with said second layer of the resistive element and a layer (13) formed with said fourth layer of the resistive element;
- an electrically insulating covering layer (25) over said resistive element and said transistor;
- at least one electrical contact hole (27) extending down through said insulating covering layer and said fourth layer into said second layer to provide for electrical contact to said fourth layer through direct lateral contact therewith and indirect contact through direct contact with said second layer and the electrical contact between the second and fourth layers;
- said indirect contact of the fourth layer comprising a contact area between said second and fourth layers over a substantially greater area than said direct contact through said contact hole with said fourth layer.

5. A device as in claim 4 in which the third layer (9) comprises silicon dioxide.

6. A device as in claim 5 in which the third layer (31) comprises silicon nitride that reduces height variations of said fourth layer ads compared with those in the case of a fourth layer of essentially only silicon dioxide for comparable performance of said resistive element.

7. A device as in claim 5 in which the third layer (33) comprises at least silicon dioxide formed under a layer of silicon nitride, at least a portion of said silicon nitride layer being is removed after the formation of the second layer and before the formation of the fourth layer.

* * * * *